United States Patent
Ghyselen et al.

(10) Patent No.: US 11,913,134 B2
(45) Date of Patent: Feb. 27, 2024

(54) PROCESS FOR MANUFACTURING A TWO-DIMENSIONAL FILM OF HEXAGONAL CRYSTALLINE STRUCTURE USING EPITAXIAL GROWTH ON A TRANSFERRED THIN METAL FILM

(71) Applicant: Soitec, Bernin (FR)

(72) Inventors: Bruno Ghyselen, Seyssinet (FR); Jean-Marc Bethoux, La Buisse (FR)

(73) Assignee: SOITEC, Brenin (FR)

( * ) Notice: Subject to any disclaimer, the term of this patent is extended or adjusted under 35 U.S.C. 154(b) by 563 days.

(21) Appl. No.: 16/481,767

(22) PCT Filed: Jan. 31, 2018

(86) PCT No.: PCT/FR2018/050217
§ 371 (c)(1),
(2) Date: Jul. 29, 2019

(87) PCT Pub. No.: WO2018/142061
PCT Pub. Date: Aug. 9, 2018

(65) Prior Publication Data
US 2019/0390366 A1 Dec. 26, 2019

(30) Foreign Application Priority Data

Feb. 2, 2017 (FR) ..................................... 1750868

(51) Int. Cl.
| | |
|---|---|
| *C30B 25/18* | (2006.01) |
| *C30B 29/02* | (2006.01) |
| *C30B 29/66* | (2006.01) |

(52) U.S. Cl.
CPC ............ *C30B 25/186* (2013.01); *C30B 29/02* (2013.01); *C30B 29/66* (2013.01)

(58) Field of Classification Search
CPC ......... C30B 25/00; C30B 25/02; C30B 25/18; C30B 25/183; C30B 25/186; C30B 29/00;
(Continued)

(56) References Cited

U.S. PATENT DOCUMENTS

| | | |
|---|---|---|
| 8,501,531 B2 | 8/2013 | Kub et al. |
| 2006/0076559 A1 | 4/2006 | Faure et al. |

(Continued)

FOREIGN PATENT DOCUMENTS

| | | |
|---|---|---|
| CN | 103354273 A | 10/2013 |
| CN | 103871684 A | 6/2014 |

(Continued)

OTHER PUBLICATIONS

Wang, et al. publication entitled "Electrochemical delamination of CVD-grown graphene film: toward the recyclable use of copper catalyst," ACS Nano, vol. 5, No. 12, pp. 9927-9933 (2011). (Year: 2011).*

(Continued)

*Primary Examiner* — Kenneth A Bratland, Jr.
(74) *Attorney, Agent, or Firm* — TraskBritt

(57) ABSTRACT

A process for manufacturing a two-dimensional film of a group IV material having a hexagonal crystalline structure, in particular, graphene, comprises formation of a growth substrate, comprising the transfer of a single-crystal metal film suitable for the growth of the two-dimensional film on a support substrate, and epitaxial growth of the two-dimensional film on the metal film of the substrate.

23 Claims, 3 Drawing Sheets

(58) Field of Classification Search
CPC ......... C30B 29/02; C30B 29/04; C30B 29/10;
C30B 29/40; C30B 29/403; C30B 29/406;
C23C 16/00; C23C 16/02; C23C 16/0272;
C23C 16/0281; C23C 16/06; C23C 16/22;
C23C 16/26; C23C 16/30; C23C 16/301;
C23C 16/303
USPC .................. 117/84, 88–90, 94, 97, 104, 106, 117/928–929, 937, 952
See application file for complete search history.

(56) References Cited

U.S. PATENT DOCUMENTS

| | | | |
|---|---|---|---|
| 2007/0169857 A1* | 7/2007 | Jeong | C30B 11/14 148/562 |
| 2009/0155561 A1* | 6/2009 | Choi | B82Y 30/00 428/220 |
| 2009/0221131 A1* | 9/2009 | Kubota | C30B 29/06 438/478 |
| 2010/0219505 A1* | 9/2010 | D'Evelyn | C30B 29/403 257/615 |
| 2012/0000415 A1* | 1/2012 | D'Evelyn | C30B 29/403 117/94 |
| 2012/0199845 A1 | 8/2012 | Werkhoven et al. | |
| 2012/0312693 A1 | 12/2012 | Veerasamy | |
| 2014/0162021 A1* | 6/2014 | Fujii | C30B 25/183 428/141 |
| 2015/0380496 A1* | 12/2015 | Ishibashi | H01L 21/02609 257/615 |
| 2016/0108546 A1* | 4/2016 | Park | C30B 29/02 429/532 |

FOREIGN PATENT DOCUMENTS

| | | |
|---|---|---|
| CN | 104170073 A | 11/2014 |
| EP | 2100989 A1 | 9/2009 |
| EP | 2540862 A1 | 1/2013 |
| JP | 2006-528593 A | 12/2006 |
| JP | 2012-001432 A | 1/2012 |
| JP | 2013-502050 A | 1/2013 |
| WO | 2014/030040 A1 | 2/2014 |
| WO | WO-2014189271 A1 * | 11/2014 ............. C30B 25/02 |

OTHER PUBLICATIONS

English Translation of Chinese First Office Action for Chinese Application No. 201880009436.3, dated Nov. 24, 2020, and Search Report, 7 pages.
French Search Report and Written Opinion for French Application No. 1750868, dated Oct. 20, 2017, 13 pages.
Costa et al., Temperature and Face Dependent Copper-Graphene Interactions, Carbon, vol. 93, (Nov. 2015), pp. 793-799.
Gao et al., Epitaxial Graphene on Cu(111), Nano Lett., vol. 10, No. 9, (2010), pp. 3512-3516 (abstact only).
International Search Report for International Application No. PCT/FR2018/050217 dated Mar. 29, 2018, 3 pages.
International Written Opinion for International Application No. PCT/FR2018/050217 dated Mar. 29, 2018, 6 pages.
Ismach et al., Direct Chemical Vapor Deposition of Graphene on Dielectric Surfaces, Nano Lett., vol. 10, (2010), pp. 1542-1548.
Levendorf et al., Transfer-Free Batch Fabrication of Single Layer Graphene Transistors, Nano Letters, vol. 9, No. 12, (2009), pp. 4479-4483.
Miller et al., Epitaxial (111) films of Cu, Ni, and CuxNiy on a2Al2O3 (0001) for graphene growth by chemical vapor deposition, Journal of Applied Physics, (Oct. 29, 2018), 13 pages.
Miller et al., Giant Secondary Grain Growth in Cu Films on Sapphire, AIP Advanced, vol. 3, (2013), 12 pages.
Rahimi et al., Towards 300mm Wafer-Scalable High-Performance Polycrystalline Chemical Vapor Deposited Graphene Transistors, Department of Electrical and Computer Engineering, The University of Texas at Austin, (Sep. 2014), 8 pages.
Tao et al., Uniform Wafer-Scale Chemical Vapor Deposition of Graphene on Ecaporated Cu (111) Film with Quality Comparable to Exfoliated Monolayer, Department of Mechanical Engineering and the Texas Materials Institute, The University of Texas in Austin, (Oct. 2012), 6 pages.
Wang et al., Electrochemical Delamination of CVD-Grown Graphene Film: Toward the Recyclable Use of Copper Catalyst, ACS Nano, vol. 5, No. 12, (2011), pp. 9927-9933.
European Communication pursuant to Article 94(3) EPC for European U.S. Appl. No. 18/705,964, dated Jun. 13, 2022, 5 pages.
Japanese Notice of Reasons for Refusal for Japanese Application No. 2019-541704, dated Jan. 4, 2022, 13 pages with English translation.
Japanese Notice of Reasons for Refusal for Japanese Application No. 2019-541704, dated Jun. 24, 2022, 10 pages with English translation.
Korean Written Opinion for Korean Application No. 10-2019-7025738 dated Jul. 27, 2022, 14 pages with English translation.

* cited by examiner

PROCESS FOR MANUFACTURING A TWO-DIMENSIONAL FILM OF HEXAGONAL CRYSTALLINE STRUCTURE USING EPITAXIAL GROWTH ON A TRANSFERRED THIN METAL FILM

CROSS-REFERENCE TO RELATED APPLICATIONS

This application is a national phase entry under 35 U.S.C. § 371 of International Patent Application PCT/FR2018/050217, filed Jan. 31, 2018, designating the United States of America and published as International Patent Publication WO 2018/142061 A1 on Aug. 9, 2018, which claims the benefit under Article 8 of the Patent Cooperation Treaty to French Patent Application Serial No. 1750868, filed Feb. 2, 2017.

TECHNICAL FIELD

The present disclosure concerns the growth of a two-dimensional film of a material of group IV of the periodic table of elements having a hexagonal crystal structure, in particular, graphene, as well as a structure comprising such a film.

BACKGROUND

Graphene films are of growing interest in various technologies, especially electronics, optoelectronics, energy, sensors, biotechnology, composite materials, etc. A graphene film consists of carbon atoms arranged in the form of a two-dimensional hexagonal crystal structure. Among the particularly interesting properties of graphene are the mobility of charge carriers, thermal conductivity in the film plane, optical transparency, good mechanical properties such as high cohesion or tensile strength, flexibility, and biocompatibility.

Processes already exist for growing a graphene film, in the form of a monoatomic layer, or a few atomic layers, on a support substrate.

A first technique uses a metal foil, particularly copper or nickel, as a support substrate, and uses a chemical vapor deposition (CVD) process to grow a graphene layer on the support substrate. Optionally, the graphene film thus formed can then be transferred to another support.

A first disadvantage of this technique is that the coefficients of thermal expansion (CTEs) of graphene and the copper or nickel support substrate are very different.

However, since the growth of the graphene film is carried out at high temperature (typically in the range of from 1000° C. to 1100° C.), this difference in coefficient of thermal expansion generates high stresses in the graphene film when it returns to room temperature.

Since the graphene film consists of no more than a few atomic layers, these stresses cause deformation and damage to the graphene during cooling. These effects may be exacerbated in later process steps of the graphene film.

A second disadvantage of the above technique is that, in order to perfectly and reproducibly control the number of deposited graphene atomic layers, (in particular, by avoiding the formation of areas where an additional layer begins to form), it must be possible to guarantee that the only source of carbon atoms comes from the deposition atmosphere and not from the growth substrate itself.

However, metal foils tend to absorb carbon atoms that are also deliberately strongly present in the deposition atmosphere and to release them unintentionally during growth or cooling. In the case of copper, this absorption is considered to be localized, mainly through grain boundaries and other defects in the copper foils that are polycrystalline. In the case of nickel, it is considered that it tends to temporarily absorb carbon to its full thickness, or at least over several micrometers from the surface exposed to the carbon atmosphere. However, the solubility limit of carbon in nickel decreases with temperature, leading to a release of carbon during cooling following the growth of the graphene film.

Finally, to precisely and reproducibly control graphene growth, it is not sufficient for the copper foil to be well textured and/or oriented, for example, by presenting only oriented grains (111), because the arrangement of the different grains (like a mosaic) can significantly influence the properties of the graphene film.

A second technique therefore aims to replace the above-mentioned metal foil with a composite substrate consisting of a copper layer deposited on a silicon or sapphire substrate. See for example, David L. Miller et al, *Epitaxial (111) films of Cu, Ni and CuxNiy on α-Al$_2$O$_3$ (0001) for graphene growth by chemical vapor deposition*, J. Appl. Phys. 112, 064317 (2012); David L. Miller et al, *Giant secondary grain growth in Cu films of sapphire*, AIP Advances 3, 082105 (2013); Ariel Ismach et al, *Direct chemical vapor deposition of graphene on dielectric surfaces*, Nano Lett. 2010, 10, 1542-1548; Somayyeh Rahimi et al, Toward 300 mm wafer-scalable high-performance polycrystalline chemical vapor deposited graphene transistors, ACS Nano, Vol. 8, No. 10, 10471-10479 (2014); and Li Tao et al, *Uniform wafer-scale chemical vapor deposition of graphene on evaporated Cu(111) film with quality comparable to exfoliated monolayer*, J. Phys. Chem. C 2012, 116, 24068-24074.

However, even when the deposition of the copper layer is optimized to promote orientation (111) along the axis normal to the substrate, the layer remains textured (polycrystalline) with the presence of orientation variants in the plane (twins). Similarly, annealing a layer of copper at high temperature (around 950° C.) makes it possible to grow some grains, but their size remains well below a millimeter.

The graphene films deposited on these composite substrates are of comparable quality to those obtained on copper foils.

To overcome the disadvantages of the polycrystallinity of copper, tests were carried out by depositing graphene on small single-crystal copper crystals, naturally free of grain boundaries. Li Gao et al, *Epitaxial graphene on Cu(111)*, Nano Lett. 2010, 10, 3512-3516.

However, this third technique does not solve the problem of the difference in coefficient of thermal expansion. In addition, the use of copper single crystals that are very expensive and too small, does not lend itself to industrial application. Finally, this technique does not solve the problem of volume absorption by nickel.

The document U.S. Pat. No. 8,501,531 proposes to avoid deposition of graphene by CVD and describes a process in which a metal layer with a determined carbon concentration is deposited on a substrate that undergoes heat treatment comprising a heating step to diffuse carbon inside the metal layer and then a step of sufficiently rapid cooling to migrate carbon out of the metal layer and organize itself as graphene on the surface of the metal layer. However, this technique has certain disadvantages. First, it should be noted that the graphene formation temperature is poorly defined. Indeed, this technique requires exposing the structure to high temperatures in order to incorporate carbon into the metal layer, and graphene is formed during cooling due to over-saturation of carbon. Wrinkles in the graphene film are therefore generally observed. In addition, the metal layer obtained by deposition is polycrystalline. The roughness of the deposited films is generally high, and may be higher than 10 or so nanometers. It is thus difficult to control thickness for thin deposited films, such as thicknesses less than 10 nm.

BRIEF SUMMARY

One object of the present disclosure is to overcome the above-mentioned disadvantages and to design a process for manufacturing a two-dimensional film of a group-IV material having a hexagonal crystal structure, in particular, graphene, which makes it possible to precisely control the growth of one or more atomic layers that provides a better quality film than the films currently available.

To that end, a process for manufacturing a two-dimensional film of a group-IV material having a hexagonal crystal structure is disclosed herein. The process comprises:
  the formation of a growth substrate, comprising the transfer of a single-crystal metal film adapted for growth of the two-dimensional film onto a support substrate, and
  the epitaxial growth of the two-dimensional film on the metal film of the substrate.

Advantageously, the metal film comprises at least one of the following metals: nickel, copper, platinum, cobalt, chromium, iron, zinc, aluminum, iridium, ruthenium, and silver.

Preferably, the metal film has a thickness of 1 µm or less, preferably 0.1 µm or less.

The support substrate can be a quartz, graphite, silicon, sapphire, ceramic, nitride, carbide, alumina or metal substrate.

According to one embodiment of the disclosure, the support substrate has, with respect to the material of the two-dimensional film, a smaller difference in coefficient of thermal expansion than between the metal film and the two-dimensional film.

According to one embodiment of the present disclosure, the transfer of the metal film comprises:
  the provision of a single-crystal metal donor substrate,
  the assembly of the donor substrate and the support substrate, and
  the thinning of the donor substrate so as to transfer the metal film to the support substrate.

The single-crystal metal donor substrate is advantageously obtained by pulling an ingot.

According to one embodiment, the process further comprises a step of formation of an embrittlement zone in the donor substrate, so as to delimit the single-crystal metal film to be transferred, and the thinning of the donor substrate comprises a detachment of the donor substrate along the embrittlement zone.

According to one embodiment, the embrittlement zone is formed by implantation of atomic species in the donor substrate.

According to one embodiment, the assembly of the donor substrate and the support substrate is carried out by bonding.

Alternatively, the assembly of the donor substrate and the support substrate is carried out by deposition of the support substrate on the donor substrate.

In a particular embodiment, the single-crystal metal film is in the form of a plurality of blocks, each transferred to the support substrate.

Each block advantageously has the same surface area as the donor substrate, the surface area being less than the surface area of the support substrate.

According to one embodiment, the growth substrate has a removable interface.

The interface can be configured to be disassembled by laser lift-off, chemical etching, or by application of mechanical force.

In addition, the process may comprise, after the growth of the two-dimensional film, a step of separation of the two-dimensional film from the growth substrate.

According to one embodiment, the separation may comprise a delamination of the interface between the single-crystal metal film and the support substrate.

Alternatively, the separation may comprise an implantation of atomic species into the support substrate so as to form an embrittlement zone, and then detachment of the growth substrate along the embrittlement zone.

In a particular embodiment, the process comprises, after the separation, the transfer of a new single-crystal metal film onto the support substrate so as to form a new growth substrate, and then the growth of a new two-dimensional film of a group-IV material having a hexagonal crystal structure on the new growth substrate.

According to another embodiment, the separation comprises a delamination of the interface between the two-dimensional film and the single-crystal metal film of the growth substrate.

In a particular embodiment, the process comprises, after the separation, the reuse of the growth substrate to grow a new two-dimensional film of a group-IV material having a hexagonal crystal structure on the substrate.

Optionally, the process may comprise, after the growth of the two-dimensional film, an etching of the metal film so as to transfer the two-dimensional film to the support substrate.

According to an advantageous embodiment of the present disclosure, the two-dimensional film is a graphene film.

In additional embodiments, the present disclosure includes a structure obtained by the process just described. The structure comprises successively a support substrate, a single-crystal metal film and a two-dimensional film of a group-IV material having a hexagonal crystal structure on the metal film.

According to one embodiment, the metal film is in the form of a plurality of blocks distributed over the surface of the support substrate.

Advantageously, the two-dimensional film includes one or more monoatomic layers.

According to one embodiment, the two-dimensional film is a graphene film.

BRIEF DESCRIPTION OF THE DRAWINGS

Other features and advantages of embodiments of the present disclosure will be better understood when reading the detailed description that follows, with reference to the attached drawings in which.

To make the figures easier to read, the different layers are not necessarily drawn to scale.

DETAILED DESCRIPTION

For reasons of brevity, the following description refers to the growth of a graphene film, but the present disclosure also applies to the other group IV elements of the periodic table of elements that form a two-dimensional film of hexagonal crystal structure, namely silicon (the film material being referred to as "silicene"), germanium (the film material being referred to as "germanene") and tin (the film material being referred to as "stanene").

Figure 1:
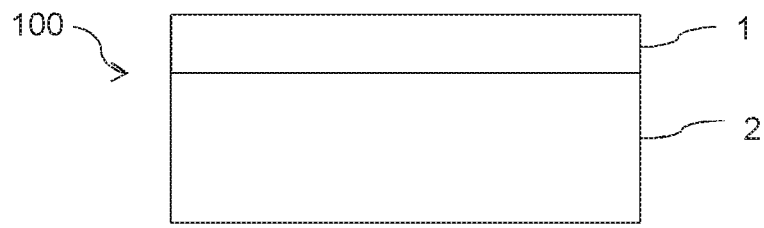
FIG. 1 illustrates a substrate for the growth of a graphene film according to one embodiment of the disclosure.

FIG. 1 illustrates a substrate 100 for the growth of a graphene film according to one embodiment of the present disclosure.

The substrate 100 comprises a single-crystal metal film 1 adapted for the growth of graphene, on a support substrate 2.

The substrate 100 is obtained by transfer of the metal film 1 onto the support substrate 2 from a donor substrate. This transfer can be carried out by the Smart Cut™ process as described below, but other transfer processes involving an assembly of the donor substrate on the support substrate 2 and then a thinning of the donor substrate until the desired thickness of the metal film 1 is obtained can be implemented.

The metal film 1 comprises at least one of the following metals: nickel, copper, platinum, cobalt, chromium, iron, zinc, aluminum, iridium, ruthenium, and silver. Optionally, the metal film 1 may comprise an alloy of such metals, or an alloy comprising at least one of such metals and at least one other metal.

The thickness of the single-crystal metal film 1 is advantageously 1 µm or less, preferably 0.1 µm or less.

This thickness of the metal film 1 is typically at least 10 times lower than the thickness of the metal foils used conventionally for graphene growth. Thus, the absorption effect of the atoms mentioned above is considerably reduced, especially in the case of nickel, where the absorption phenomenon occurs throughout the thickness of the metal film 1.

However, such a thickness is sufficient to fulfil the main function of the metal film 1, which is to form a seed layer for graphene growth. Indeed, the single-crystal character of the metal film 1 allows the formation of a graphene film with an excellent crystal quality.

Finally, due to its thinness, the metal film 1 has little influence on the thermal expansion of the substrate 100 during the growth of the graphene film, the thermal expansion being essentially due to the thermal expansion of the support substrate 2.

The main function of the support substrate 2 is to mechanically support the metal film 1 during the growth of the graphene film.

The material of the support substrate 2 must therefore withstand the conditions (especially temperature and chemical environment) of graphene film growth that may vary depending on the deposition technique chosen. Thus, chemical vapor deposition (CVD) is implemented at a higher temperature than molecular beam epitaxy (MBE).

According to an advantageous but not imperative embodiment, the material of the support substrate 2 is chosen to have, with respect to graphene, a smaller difference in coefficient of thermal expansion than between the metal film 1 and graphene. Preferably, the difference in coefficient of thermal expansion between graphene and the material of the support substrate 2 is minimized, it being recalled, however, that the difference in coefficient of thermal expansion between graphene and the material of the support substrate 2 is all the more acceptable when the graphene growth temperature is low.

The support substrate 2 is advantageously single-crystal because this configuration is more favorable for the polishing of the surface of the substrate 2 before the transfer of the metal film 1 (when this transfer involves bonding), but this property is not imperative. As indicated below, the support substrate 2 can optionally be formed by deposition.

Advantageously, the preferred materials for the support substrate 2 are, in particular, quartz, graphite, silicon, sapphire, ceramics, nitrides, carbides, alumina, and metals.

Optionally, the support substrate 2 may have, at the interface with the metal film 1, an encapsulation layer (not shown) to promote adhesion between the metal film 1 and the support substrate 2, and/or to form a diffusion barrier to prevent pollution of the graphene by elements of the support substrate 2. Conversely, the material of the support substrate 2 may have in certain cases signs of decomposition or deterioration when exposed directly to the growth atmosphere of the graphene film, or when exposed to the assembly conditions of the metal film 1. A diffusion barrier also makes it possible in this case to remove or limit these effects. Such an encapsulation layer can be made of, for example, materials selected from among oxides, nitrides, carbides.

After obtaining the graphene film, it can be detached from the substrate 100 used for its growth.

Figure 2:
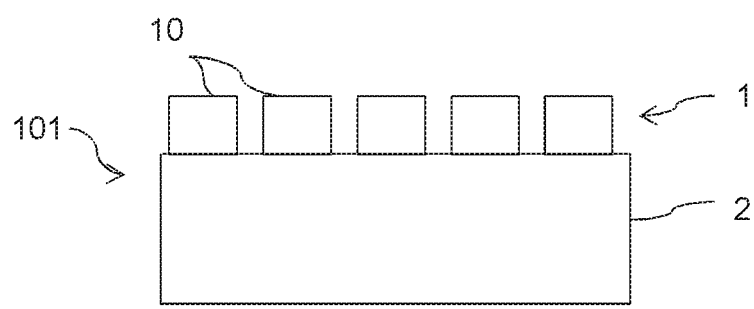
FIG. 2 illustrates a substrate for the growth of a graphene film according to another embodiment of the disclosure.

It should be noted that the metal film 1 is not necessarily continuous on the surface of the support substrate 2. On the contrary, as shown in FIG. 2, the metal film 1 may comprise a set of single-crystal metal blocks 10 distributed over the surface of the support substrate 2. The blocks 10 may be contiguous or separated from one another, as shown in FIG. 2. As will be seen below, these blocks 10 allow the use of small metal single crystals in relation to the size of the support substrate 2. Size, as used here, means the surface area of the surfaces in contact between the blocks 10 and the support substrate 2. The blocks 10 are advantageously rectangular, but other shapes may be employed. By way of another example, these blocks 10 can also be in the form of strips, discs, hexagons, etc. The shape of the blocks 10 and their arrangement on the surface of the support substrate 2 may be determined depending on the geometry of the donor support substrate 2 and the surface area of the graphene film to be formed.

Examples of Growth Substrate According to the Embodiments of the Disclosure

Example No. 1

In this example, the single-crystal metal film 1 is copper and the support substrate 2 is a silicon substrate successively coated with a 0.4-µm $SiO_2$ film and a 0.1-µm copper film to provide direct Cu/Cu metal bonding between the support substrate 2 and the metal film 1.

Example No. 2

In this example, the single-crystal metal film 1 is nickel and the support substrate 2 is a molybdenum substrate, each coated with a 0.2-μm copper film to provide direct Cu/Cu metal bonding between the support substrate 2 and the metal film 1.

Example No. 3

In this example, the single-crystal metal film 1 is nickel and the support substrate 2 is a polycrystalline AlN ceramic coated successively with a 0.3-μm $Si_3N_4$ film and a 0.5-μm $SiO_2$ film.

Example No. 4

In this example, the single-crystal metal film 1 is copper and the support substrate 2 is sapphire coated with a 0.3-μm $SiO_2$ film.

Example No. 5

In this example, the single-crystal metal film 1 is copper and the support substrate 2 is a 20-μm thick polycrystalline copper film assembled by direct Cu/Cu metal bonding on a donor substrate after formation of an embrittlement zone by implantation of ions therein.

Example No. 5

In this example, the single-crystal metal film 1 is copper and the support substrate 2 is a nickel film deposited by electrodeposition to a thickness of 15 μm directly on a donor substrate after formation of an embrittlement zone by implantation of ions therein.

Example No. 6

In this example, the single-crystal metal film 1 is copper and the support substrate 2 is a nickel-copper alloy film deposited by electrodeposition to a thickness of 15 μm directly on a donor substrate after formation of an embrittlement zone by implantation of ions therein.

Example No. 7

In this example, the single-crystal metal film 1 is a nickel-copper alloy and the support substrate 2 is a nickel film deposited by electrodeposition to a thickness of 15 μm directly on a donor substrate after formation of an embrittlement zone by implantation of ions therein.

Example No. 8

In this example, the single-crystal metal film 1 is in the form of a plurality of single-crystal nickel blocks 10 positioned contiguously on a planar support and the support substrate 2 is a nickel film deposited directly on a side of the plurality of blocks 10 through which an embrittlement zone has been previously formed by hydrogen implantation, the deposition of the nickel film being carried out by electrodeposition to a thickness of 10 μm.

A process for manufacturing a substrate 100 as shown in FIG. 1, according to one embodiment of the disclosure, is described below.

Figure 3A:
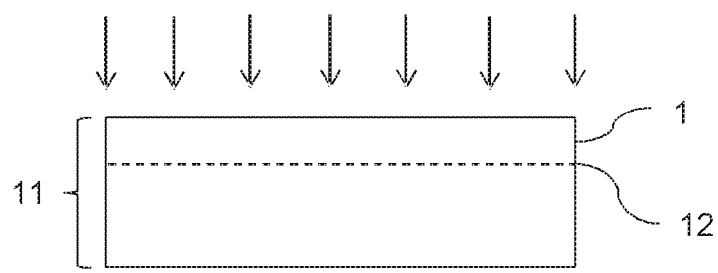
FIGS. 3A to 3B illustrate the main features of a process for manufacturing the substrate of FIG. 1 according to one embodiment of the disclosure.

Referring to FIG. 3A, a donor substrate 11 comprising a metal single crystal is provided.

An embrittlement zone 12 is formed in the donor substrate 11 by implantation of atomic species (schematized by the arrows), the embrittlement zone delimiting, on the surface of the donor substrate 11, and the single-crystal metal film to be transferred to the support substrate 2. The atomic species may include hydrogen, in particular. Helium is another species of particular interest from this point of view, either as a replacement for hydrogen or in combination with hydrogen.

Figure 3B:
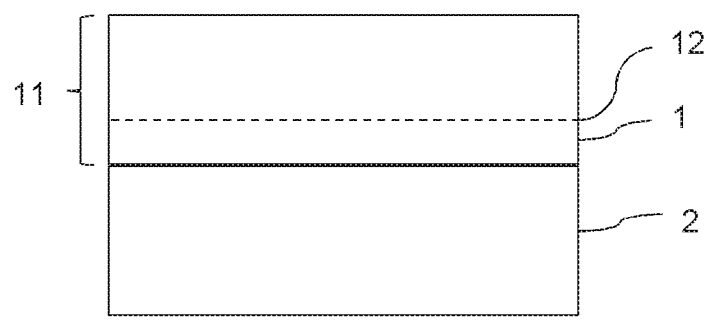

With reference to FIG. 3B, the donor substrate 11 is assembled on a support substrate 2, the metal film to be transferred being at the bonding interface.

According to one embodiment, this assembly is achieved by bonding the support substrate 2 and the donor substrate 11.

According to another embodiment, this assembly is achieved by deposition of the support substrate 2 onto the donor substrate 11 by any appropriate deposition technique, depending on the nature of the support substrate 2.

Next, the donor substrate 11 is detached along the embrittlement zone 12. The detachment may be initiated by, for example, application of mechanical, chemical, and/or thermal stress. This detachment results in the transfer of the single-crystal metal film 1 to the support substrate 2. The substrate 100 shown in FIG. 1 is thus obtained.

Optionally, a finishing treatment is carried out on the surface of the single-crystal metal film 1 to make it suitable for subsequent deposition of the graphene film. This may be, for example, a polishing, annealing and/or etching operation.

Naturally, the skilled person is able to define the procedure according to the material of the donor substrate 11 and the thickness of the film to be transferred.

Variations of the metal film transfer process may be employed.

A first variant relates to the assembly of the donor substrate and the support substrate. Instead of an assembly by bonding the donor substrate 11 to the support substrate 2, the assembly may involve deposition of the support substrate 2 onto the donor substrate 11, with the film to be transferred being on the side of the donor substrate 11 on which the deposition is performed. Optionally, a diffusion barrier layer is formed between the donor substrate 11 and the support substrate 2 to prevent the diffusion of unwanted species from the support substrate 2 to the graphene layer during its growth.

A second variant, which may optionally be combined with the first variant, relates to the method for thinning the donor substrate 11 to transfer the metal film to the support substrate 2. Thus, instead of thinning by detaching the donor substrate 11 along the embrittlement zone 12, it is possible to remove material, (in particular, by etching or mechanical removal such as grinding or polishing) from the donor substrate 11 from the side thereof opposite the interface with the support substrate 2, until the desired thickness is obtained for the metal film 1 to be transferred.

A process for manufacturing a substrate 101 as shown in FIG. 2 will now be described.

According to one embodiment, the blocks 10 are assembled successively and then collectively transferred to the support substrate 2. To that end, a donor substrate 11 made of a metal single crystal is provided, the surface area of which is smaller than that of the support substrate 2 intended to receive it.

As already explained with reference to FIG. 3A, an embrittlement zone 12 is formed in the donor substrate 11.

Figure 4A:
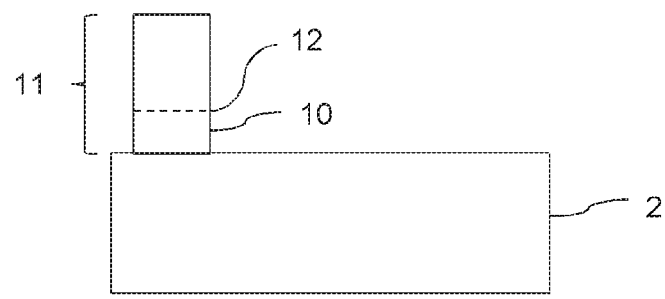
FIGS. 4A to 4B illustrate the main steps of a process for manufacturing the substrate of FIG. 2 according to one embodiment of the disclosure.

Referring to FIG. 4A, a first donor substrate 11 is then bonded to the support substrate 2.

Figure 4B:
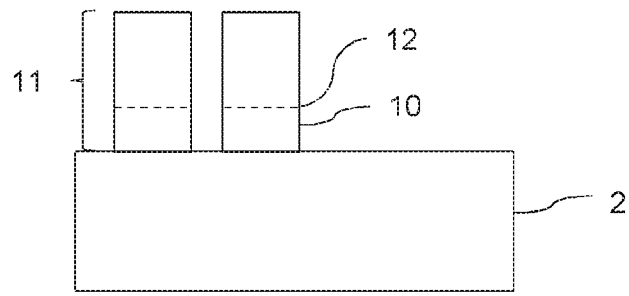

As shown in FIG. 4B, a second donor substrate 11 is bonded to the support substrate 2, and this assembly operation is continued until all the donor substrates 11 necessary to obtain all the blocks 10 on the support substrate 2 are bonded.

Next, all the donor substrates 11 are detached along their respective embrittlement zone 12 to transfer all the single-crystal metal blocks 10 to the support substrate 2.

The procedure described above for the transfer of a continuous metal film onto the support substrate 2 is applicable, with possible adaptations within the competence of the person of ordinary skill in the art, to the transfer of one or more metal blocks onto the support substrate 2.

According to one variant (not shown) of this process, after the bonding of a first donor substrate 11 to the support substrate 2, the donor substrate 11 is detached along the embrittlement zone 12 to transfer a first single-crystal metal block to the support substrate 2, and this sequence is repeated with a subsequent donor substrate 11 until all the blocks 10 are transferred to the support substrate 2.

The donor substrate 11 may optionally be the same as the one from which the first block 10 was collected, and, thus, may be used several times to transfer a block to the same support substrate 2.

Alternatively, the donor substrate 11 may be different from the one from which the first block 10 was collected. After transferring all the metal blocks 10, all the donor substrates 11 can be reused to carry out a new cycle. Recycling operations may be desirable or necessary. For example, a polishing operation will make it possible to start with an adequate surface roughness for a good quality assembly.

In addition, although the new donor substrate 11 is shown separated from the previously transferred block 10 by a distance, it could be positioned adjacent to the previously transferred block 10.

Thus, a plurality of blocks 10 are successively transferred to the support substrate 2, allowing the substrate 101 illustrated in FIG. 2 to be obtained.

According to another embodiment, the blocks 10 are assembled and transferred collectively onto the support substrate 2.

Figure 5A:
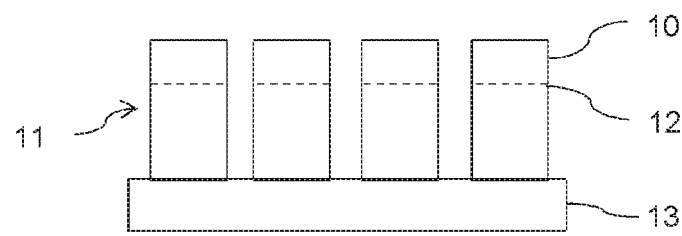
FIGS. 5A to 5B illustrate the main steps of a process for manufacturing the substrate of FIG. 2 according to another embodiment of the disclosure.

To that end, as shown in FIG. 5A, a plurality of donor substrates 11 are assembled on an intermediate substrate 13, the intermediate substrate essentially serving as a mechanical support or handling tool for the donor substrates 11. The donor substrates 11 are shown as being separated from one another by a distance, but they could be juxtaposed in a joint manner in additional embodiments.

An embrittlement zone 12 is formed in each donor substrate 11, before or after their assembly on the intermediate substrate 13, so as to delimit a block 10 to be transferred to the support substrate 2.

Figure 5B:
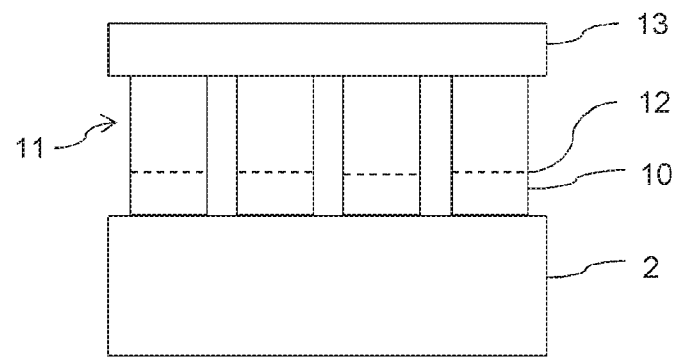

With reference to FIG. 5B, the intermediate substrate 13 carrying the donor substrates 11 is bonded to the support substrate 2, the free surface of the donor substrates 11 being at the bonding interface.

Next, all the donor substrates 11 are detached along their respective embrittlement zone 12, so as to transfer all the blocks 10 to the support substrate 2. The substrate 101 shown in FIG. 2 is thus obtained.

Preferably, the detachment step is performed collectively for all the donor substrates 11.

According to a variant, the detachment step can be performed successively for each donor substrate 11.

Optionally, the intermediate substrate 13 carrying the remaining donor substrates 11 can be recycled for a new collective transfer of blocks 10. To that end, the free surfaces of the donor substrates 11 are treated to remove defects related to detachment, a new embrittlement zone 12 is formed in each of the donor substrates, and the intermediate substrate 13 carrying the embrittled donor substrates 11 is bonded to a new support substrate 2.

Advantageously, the preparation of the blocks 10 is organized upstream of the growth substrate manufacturing process. To that end, for example, metal ingots are assembled together before being collectively cut to form donor substrates 11, then collectively implanted with ions before being assembled to the support substrate 2.

The growth substrate having a continuous or discontinuous (blocks) single-crystal metal film is then used for the growth of a graphene film.

Any technique known for growing graphene can be used.

By way of non-limiting example, mention may be made of chemical vapor deposition (CVD) and molecular beam epitaxy (MBE). The parameters of these processes allowing the growth of a graphene layer are known or determinable by the person of ordinary skill in the art and, therefore, will not be described in detail herein.

Figure 6:
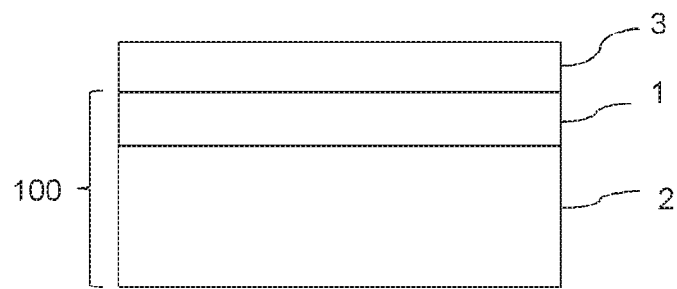
FIG. 6 illustrates a structure comprising a graphene film formed by epitaxial growth on the substrate of FIG. 1.

FIG. 6 shows a graphene film 3 formed on a growth substrate 100.

The graphene film 3 advantageously comprises one or more monoatomic layers of graphene, which layers may be complete (i.e., continuous over the entire surface of the metal film) or not.

Depending on the intended applications for the graphene film and the quality required for the film, it may be of interest to form a single atomic layer of graphene, or a stack of two or more monoatomic layers of graphene, making sure that each monoatomic layer is complete and avoiding initiation of the formation of a new (incomplete) layer on a complete monoatomic layer.

This quality control of the graphene film 3 is made possible not only by the parameters of the graphene deposition process, but also by the excellent crystal quality and/or the thinness of the metal film 1 that serves as the seed for graphene growth.

Indeed, on the one hand, the precise control of the number of monoatomic layers formed is based on the fact that the carbon atoms constituting the graphene film 3 layer come only from the deposition atmosphere and not from the growth substrate itself.

Thus, in the case of copper, the single-crystal film used in the embodiments of the present disclosure is of better quality than the copper foils used in the prior art, which are polycrystalline. To the extent that the presence of grain boundaries or other crystal defects is minimized in the copper film according to the present disclosure, the absorption sites of carbon atoms are thus minimized.

In the case of nickel, the superior quality of the single-crystal film used in the embodiments of the present disclosure has the same advantage as in the case of copper, to which is added a minimum volume for the absorption of carbon atoms, due to the considerably reduced thickness of the single-crystal film compared with the foils usually used.

Consequently, since the absorption of carbon atoms into the single-crystal metal film is minimized, the release of such atoms during the growth of the graphene film or subsequent cooling thereof is avoided or at least considerably reduced.

On the other hand, in the case where the support substrate 2 is chosen to have a small difference in coefficient of thermal expansion with respect to the graphene film (the single-crystal metal film being thin enough to have a negligible influence), the mechanical stresses applied to the graphene film during its cooling are minimized. This prevents or reduces relaxation or damage to the graphene film. This also contributes to a better quality of the graphene film.

Finally, in contrast to composite substrates of the prior art in which a polycrystalline copper film is deposited on a support substrate, the fact that the metal film of the disclosure is single-crystal allows the orientation, (for example, 111) of the graphene film to be controlled over the entire surface of the metal film.

After the graphene film has formed, it can be separated from the growth substrate in order to be optionally transferred to another support.

This separation can be carried out in different ways.

According to one embodiment, the growth substrate comprises a removable interface, i.e., an interface at which the application of a stress (or a treatment) allows a detachment of two parts of the substrate. The term "interface" is used here in the broad sense, in particular, in that it may contain one or more layers of non-zero thickness.

In this respect, any known separation technique in the field of microelectronics may be used, the person of ordinary skill in the art being able to select the appropriate materials according to the chosen technique.

Possible techniques include (optionally in combination):
application of mechanical stress,
chemical attack,
decomposition,
fusion, and/or
laser lift-off.

The removable interface can be located between the single-crystal metal film and the support substrate or located inside the support substrate.

Figure 7:
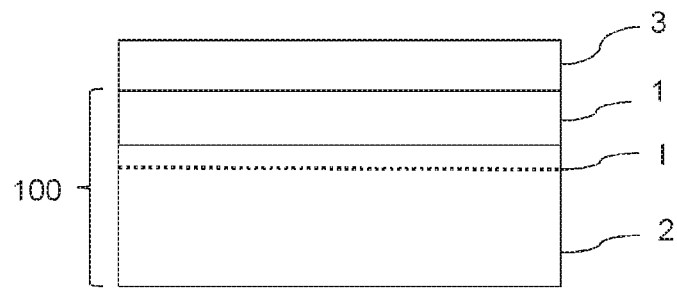
FIG. 7 illustrates a structure comprising a graphene film on a growth substrate comprising a removable interface.

FIG. 7 thus illustrates an embodiment in which the removable interface I is located within the support substrate 2.

For example, the interface I comprises a bonding interface, a region of a material adapted to confine a mechanical fracture, such as a porous layer, (for example, silicon), a layer allowing selective etching against another, an embrittlement zone formed by implantation in the support substrate, etc.

Alternatively, the separation of the graphene film from the growth substrate can be based on any known disassembly technique in the graphene domain.

According to one embodiment, the disassembly of the graphene film comprises a delamination of the interface between the metal film and the support substrate, then optionally chemical etching of the metal film. In this case, the support substrate can be reused for the transfer of a new metal film, in order to form a new substrate for graphene growth.

According to another embodiment, the disassembly of the graphene film comprises a delamination of the interface between the graphene film and the metal film. Such a delamination technique is described in Yu Wang et al, *Electrochemical delamination of CVD-grown graphene film: toward the recyclable use of copper catalyst*, ACS Nano, Vol. 5, No. 12, 9927-9933, 2011, in the case of a growth substrate consisting of a copper foil. After such delamination, the growth substrate can be reused for the growth of a new graphene film.

Figure 8:
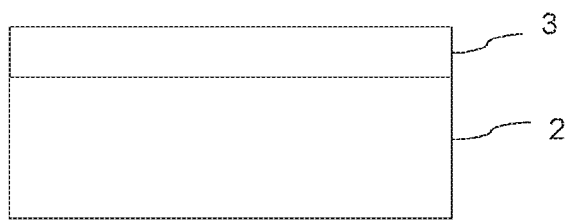
FIG. 8 illustrates a structure in which the metal film of the growth substrate has been etched after the growth of the graphene film.

It is also possible to transfer the graphene film directly to the support substrate by etching the single-crystal metal film located between the graphene film and the support substrate. The structure shown in FIG. 8 is thus obtained. Such a process is described, in particular, in Mark P. Levendorf et al, *Transfer-free batch fabrication of single layer graphene transistors*, Nano Lett., Vol. 9, No. 12, 2009, in the case where the growth substrate comprises a copper film formed by evaporation on a silicon substrate coated with a thermal oxide.

The invention claimed is:

1. A process for manufacturing a two-dimensional film of a group-IV material having a hexagonal crystal structure, comprising:
providing a single-crystal metal donor substrate;
forming an embrittlement zone in the donor substrate so as to delimit a single-crystal metal film to be transferred;
assembling the donor substrate with a support substrate;
thinning the donor substrate so as to transfer the single-crystal metal film to the support substrate by detaching the donor substrate along the embrittlement zone so as to form a growth substrate comprising the transferred single-crystal metal film and the support substrate, the transferred single-crystal metal film having a thickness of 1 μm or less; and
epitaxially growing the two-dimensional film on the transferred single-crystal metal film of the growth substrate.

2. The process of claim 1, wherein the transferred single-crystal metal film comprises at least one metal selected from among: nickel, copper, platinum, cobalt, chromium, iron, zinc, aluminum, iridium, ruthenium, and silver.

3. The process of claim 1, wherein the transferred single-crystal metal film has a thickness of 0.1 μm or less.

4. The process of claim 1, wherein the support substrate is a quartz, graphite, silicon, sapphire, ceramic, nitride, carbide, alumina or metal substrate.

5. The process of claim 1, wherein the support substrate has, with respect to the material of the two-dimensional film, a smaller difference in coefficient of thermal expansion than between the transferred single-crystal metal film and the two-dimensional film.

6. The process of claim 1, wherein the single-crystal metal donor substrate is obtained by pulling an ingot.

7. The process of claim 1, wherein the embrittlement zone is formed by implantation of atomic species in the donor substrate.

8. The process of claim 1, wherein the assembly of the donor substrate and the support substrate is carried out by bonding.

9. The process of claim 1, wherein assembling the donor substrate and the support substrate is carried out by deposition of the support substrate on the donor substrate.

10. The process of claim 1, wherein the transferred single-crystal metal film is in the form of a plurality of blocks each transferred to the support substrate.

11. The process of claim 10, wherein the assembly of the donor substrate and the support substrate is carried out by bonding, and wherein each block has the same surface area as the donor substrate, the surface area being smaller than the surface area of the support substrate.

12. The process of claim 1, wherein the growth substrate comprises a removable interface.

13. The process of claim 12, wherein the interface is configured to be disassembled by laser lift-off.

14. The process of claim 12, wherein the interface is configured to be disassembled by chemical etching.

15. The process of claim 12, wherein the interface is configured to be disassembled by application of mechanical force.

16. The process of claim 1, further comprising, after the growth of the two-dimensional film, separating the two-dimensional film from the growth substrate.

17. The process of claim 16, wherein the separating comprises a delamination of an interface between the single-crystal metal film and the support substrate.

18. The process of claim 16, wherein the separating comprises an implantation of atomic species in the support substrate so as to form an embrittlement zone, and then the detachment of the growth substrate along the embrittlement zone.

19. The process of claim 16, further comprising, after the separating, transferring a new single-crystal metal film to the support substrate so as to form a new growth substrate, then growing a new two-dimensional film of a group-IV material having a hexagonal crystal structure on the new growth substrate.

20. The process of claim 16, wherein the separating comprises a delamination of an interface between the two-dimensional film and the single-crystal metal film of the growth substrate.

21. The process of claim 20, comprising, after the separating, reusing the growth substrate to grow a new two-dimensional film of a group-IV material having a hexagonal crystal structure on the substrate.

22. The process of claim 21, further comprising, after growing the two-dimensional film, etching the metal film so as to transfer the two-dimensional film to the support substrate.

23. The process of claim 1, wherein the two-dimensional film is a graphene film.

\* \* \* \* \*